United States Patent
Hosoba et al.

(10) Patent No.: US 6,707,834 B2
(45) Date of Patent: Mar. 16, 2004

(54) SEMICONDUCTOR LASER DEVICE AND PROCESS FOR PRODUCING THE SAME

(75) Inventors: Hiroyuki Hosoba, Soraku-gun (JP); Yasuo Kan, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 10/179,012

(22) Filed: Jun. 26, 2002

(65) Prior Publication Data

US 2003/0007530 A1 Jan. 9, 2003

(30) Foreign Application Priority Data

Jun. 26, 2001 (JP) ........................ 2001-192439

(51) Int. Cl.⁷ ............................................ H01S 5/00
(52) U.S. Cl. .............................. 372/46; 372/45
(58) Field of Search ........................ 372/43–46

(56) References Cited

U.S. PATENT DOCUMENTS

| | | | |
|---|---|---|---|
| 4,694,460 A | | 9/1987 | Hayakawa et al. |
| 4,809,282 A | * | 2/1989 | Dewhirst ................. 372/16 |
| 4,949,349 A | * | 8/1990 | Ohba et al. .............. 372/45 |
| 5,065,404 A | * | 11/1991 | Okajima et al. .......... 372/46 |
| 5,282,218 A | * | 1/1994 | Okajima et al. .......... 372/46 |
| 5,604,764 A | * | 2/1997 | Motoda et al. ........... 372/46 |
| 5,663,974 A | * | 9/1997 | Tsujimura et al. ........ 372/45 |
| 5,789,773 A | | 8/1998 | Takeoka et al. |
| 6,002,701 A | * | 12/1999 | Kan et al. ............... 372/46 |
| 6,046,464 A | * | 4/2000 | Schetzina ................ 257/96 |
| 6,087,725 A | * | 7/2000 | Yoshii et al. ............ 257/744 |
| 6,181,723 B1 | * | 1/2001 | Okubo et al. ............ 372/45 |
| 6,242,764 B1 | * | 6/2001 | Ohba et al. ............. 257/190 |
| 6,377,598 B1 | * | 4/2002 | Watanabe et al. ......... 372/46 |
| 6,424,668 B1 | * | 7/2002 | Murayama ............... 372/45 |
| 6,518,159 B1 | * | 2/2003 | Tsunoda ................. 438/604 |

FOREIGN PATENT DOCUMENTS

| | | | | |
|---|---|---|---|---|
| JP | | 62200785 | 9/1987 | |
| JP | | 1241190 | 9/1989 | |
| JP | | 5007049 | 1/1993 | |
| JP | | 6132603 | 5/1994 | |
| JP | | 2000031585 A | * 1/2000 | ............. H01S/5/30 |

* cited by examiner

*Primary Examiner*—Paul Ip
*Assistant Examiner*—Phillip Nguyen
(74) *Attorney, Agent, or Firm*—Morrison & Foerster LLP

(57) ABSTRACT

In a semiconductor laser element, an active layer is sandwiched between first-conductivity type and second-conductivity type cladding layers, and a second-conductivity type contact layer is disposed above the second cladding layer with an intermediate bandgap layer interposed between the second cladding layer and the contact layer, the second-conductivity type contact layer having a bandgap different from a bandgap of the second-conductivity type cladding layer, the intermediate bandgap layer having an intermediate bandgap between the bandgaps of the second-conductivity type cladding layer and the second-conductivity type contact layer. The second-conductivity type contact layer has at least a first contact layer, an intermediate second contact layer and a third contact layer stacked in this order and the second contact layer has an impurity density lower than impurity densities of the first and third contact layers.

20 Claims, 5 Drawing Sheets

SEMICONDUCTOR LASER DEVICE AND PROCESS FOR PRODUCING THE SAME

BACKGROUND OF THE INVENTION

The present invention generally relates to a III-V compound semiconductor laser device. Particularly, it relates to the structure of an AlGaInP semiconductor laser device, which can be operated at a low voltage, and a process for producing the same.

The AlGaInP semiconductor material having a lattice constant almost equal to a lattice constant of a GaAs substrate can achieve crystal growth with high quality. Further, because the AlGaInP semiconductor material is a direct transition-type semiconductor having the largest bandgap among the III-V compound semiconductor materials other than nitrides, it has been developed as a light-emitting material for light in the visible range. In particular, AlGaInP semiconductor laser devices have been widely used as light sources for optical disks, because they have shorter oscillation wavelengths compared with AlGaAs semiconductor laser devices, and enable a high-density recording.

The bandgap of the $(Al_xGa_{1-x})_yIn_{1-y}P$ ($0 \leq x \leq 1$, $y=0.5$) material can be varied between 1.91 eV (GaInP) and 2.35 eV (AlInP) by changing the mixed crystal ratio x of Al from 0 to 1. Incidentally, the bandgap of GaAs is about 1.42 eV, and there is a big difference in the bandgap between a GaAs material and an AlGaInP material. When an AlGaInP layer is grown on a GaAs layer, band discontinuity due to a big difference in the bandgap occurs at a hetero-interface between the two layers. In particular, large band discontinuity occurs in a valence band and it acts as a barrier against injected holes resulting in an increase in the operation voltage of the laser element.

It is known from JP-A-5-7049, for example, that the above problem can be solved by providing, between a GaAs layer and an AlGaInP layer, a layer having a bandgap intermediate between the two layers. FIG. 9 is a view seen from an end surface of a semiconductor laser device taking such a countermeasure. Referring to FIG. 9, an n-type GaAs buffer layer 102, an n-type GaInP intermediate layer 103, an n-type AlInP cladding layer 104, a GaInP active layer 105, a p-type AlInP cladding layer 106, a GaInP etch stop layer 107, a p-type AlInP second cladding layer 108, a p-type GaInP intermediate layer 109, and a p-type GaAs contact layer 110 are formed in order on an n-type GaAs substrate 101 using an MBE method. Then the p-type GaAs contact layer 110, the p-type GaInP intermediate layer 109 and the p-type AlInP second cladding layer 108 are removed by etching, excluding a stripe-geometry ridge portion 120. Subsequently, an n-type GaAs current block layer 111 is formed at portions other than the stripe-geometry ridge portion 120, thereby obtaining a crystals-stacked structure called a wafer. After that, an n-type electrode 112, and a p-type electrode 113 are deposited, and the wafer is divided into bar-shaped pieces. A protective film is formed on each end surface of the resulting bars, thereafter the bars are divided into chips serving as semiconductor laser devices.

The p-type AlGaInP second cladding layer 108 is doped with beryllium (Be) as an impurity to a density of $4 \times 10^{17}$ cm$^{-3}$. Similarly, the p-type GaInP intermediate layer 109 is doped with Be to a density of $1 \times 10^{19}$ cm$^{-3}$ as an impurity, and the p-type GaAs contact layer 110 is doped with Be to a density of $5 \times 10^{18}$ cm$^{-3}$ as an impurity.

In the above structure, between the p-type AlInP second cladding layer 108 having a large bandgap and the p-type GaAs contact layer 110 having a small bandgap, the p-type GaInP intermediate layer 109, which has a bandgap intermediate between the above two layers, is provided, whereby band discontinuity at the interface is reduced. In addition to that, as the density of the p-type GaInP intermediate layer 109 having an intermediate bandgap increases, the band discontinuity is reduced.

SUMMARY OF THE INVENTION

The inventors have determined, with respect to the above prior art example, that if the impurity density exceeds a certain level (for example, $7 \times 10^{19}$ cm$^{-3}$ for GaInP crystals), impurity atoms do not enter appropriate lattice sites and become lattice defects such as interstitial atoms, which bring about deterioration of the quality of crystals. Therefore, the impurity density that can be doped for improving the band discontinuity has an upper limit.

Further, in the prior-art example, the p-type GaInP intermediate layer 109 is doped with Be to a density of $1 \times 10^{19}$ cm$^{-3}$, which is in the range that would not deteriorate the quality of crystals. Yet, of laser elements obtained according to the prior art, some laser elements had a high operation voltage. However, the inventors have determined that operation voltage of higher than 2.3 V does not allow practical reliability to be attained.

As a reason for this, it is presumed as follows: when the p-type GaInP intermediate layer 109 is formed and the p-type GaAs contact layer 110 is formed thereon, or when the n-type GaAs current block layer 111 is grown after forming the stripe-geometry ridge region 120, the wafer having the p-type GaInP intermediate layer 109 doped with impurities to a high density and the p-type GaAs contact layer 110 is retained at a high temperature, and thus Be atoms are diffused from the p-type GaInP intermediate layer 109 to the p-type GaAs contact layer 110. Such diffusion of impurities, which is sensitive to the temperature, and which strongly depends on the in-plane temperature distribution of the wafer, is an unstable phenomenon. For that reason, when operating the semiconductor laser device, the Be impurity density of the p-type GaInP intermediate layer 109 has already been reduced or varied and therefore the band discontinuity at the interface is not reduced sufficiently. As a result, the resistance of the laser element increases and heat generation of the laser element increases.

Under the circumstances, it has been desired to realize semiconductor laser devices that maintain the doping density of a layer having an intermediate bandgap even after a wafer was retained in a high-temperature state as in the crystal growth, that operate at a low voltage, and that have an operation voltage distribution in a narrow range.

The present invention was made in order to solve the above problem, and an object of the present invention is to provide a ridge stripe-type AlGaInP semiconductor laser device in which diffusion of impurities from a contact layer or an intermediate bandgap layer is suppressed so that the impurity density of the intermediate bandgap layer is maintained high enough and that the semiconductor laser device has a low operation voltage.

According to an aspect of the present invention, there is provided a semiconductor laser device comprising:
  an active layer;
  a first-conductivity type cladding layer and a second-conductivity type cladding layer sandwiching the active layer therebetween;
  a second-conductivity type contact layer disposed above the second-conductivity type cladding layer and having a bandgap different from a bandgap of the second-conductivity type cladding layer; and a second-conductivity type intermediate bandgap layer disposed between the second-conductivity type cladding layer and the second-conductivity type contact layer and having an intermediate bandgap between the bandgaps of the second-conductivity type cladding layer and the second-conductivity type contact layer, wherein said second-conductivity type contact layer comprises at least a first contact layer, an intermediate second contact layer and a third contact layer stacked in this order and the second contact layer has an impurity density lower than impurity densities of the first and third contact layers.

This arrangement suppresses diffusion of impurities, so that the intermediate bandgap layer can exhibit the effect of reducing band discontinuity sufficiently. Also, This arrangement allows impurities to be prevented from being diffused to the active layer, whereby an increase in the oscillation threshold current is suppressed. Thus, favorable characteristics of the semiconductor laser device are obtained.

In one embodiment, the second-conductivity type cladding layer has an impurity density smaller than that of the intermediate bandgap layer, and the impurity density of the intermediate bandgap layer is equal to or smaller than that of the first contact layer.

With this arrangement, even if the wafer is retained at a high temperature, diffusion of impurities is suppressed, and the impurity density of the intermediate bandgap layer can be secured. Therefore, it is possible to reduce the band discontinuity at the interface and lower the operation voltage, which results in an improvement in the yield of semiconductor laser devices.

In one embodiment, the semiconductor laser device has a stripe-shaped region for injecting an electric current into the active layer and a first-conductivity type current block layer is provided in regions other than the current injection region.

With this arrangement, it becomes possible to control optical radiation characteristics, resulting in an improvement in the performance of the semiconductor laser device.

The second-conductivity type cladding layer may comprise a first cladding layer and a second cladding layer on or above the first cladding layer, and the stripe-shaped region may comprise at least the second cladding layer from among the second cladding layer, the intermediate bandgap layer and the second-conductivity type contact layer.

Each of the first-conductivity type cladding layer, the active layer, the second-conductivity type cladding layer and the intermediate bandgap layer may be made of $(Al_xGa_{1-x})_yIn_{1-y}P$ ($0<x<1$, $0<y<1$). With this arrangement, it is possible to realize a semiconductor laser device with a light-emitting wavelength in a 600-nm band, which is adapted to a system such as DVD and DVD-RW.

The second-conductivity type contact layer may be made of GaAs. With this arrangement, it becomes easy to form an ohmic contact of the contact layer with an electrode metal. As a result, this structure is effective in reducing the operation voltage of the semiconductor laser device.

In one embodiment, the second-conductivity type is a p type, and the second-conductivity type cladding layer, the second-conductivity type intermediate bandgap layer and the second-conductivity type contact layer contain beryllium (Be) as a p-type impurity. Be is a p-type impurity that can be doped in an AlGaInP-type material up to a high density. Further, diffusion of Be in crystals is slighter than zinc (Zn), which is used as a p-type impurity in the MOCVD (organic metal vapor deposition) method. Therefore, it is possible to realize an impurity profile as designed. Moreover, the impurity profile has superior reproducibility, which can greatly contribute to an improvement in the characteristics and the yield of semiconductor laser devices.

In one embodiment, the intermediate bandgap layer has an impurity density of $5 \times 10^{18}$ cm$^{-3}$ or higher. With this arrangement, it becomes possible to hold down the operation voltage of the semiconductor element.

Additionally or alternatively, the second contact layer may have an impurity density in the range between $5 \times 10^{17}$ cm$^{-3}$ and $5 \times 10^{18}$ cm$^{-3}$ inclusive. With this arrangement, the operation voltage of the semiconductor laser device is lowered and also it becomes possible to suppress an increase in the oscillation threshold current.

Additionally or alternatively, the third contact layer may have an impurity density of $5 \times 10^{18}$ cm$^{-3}$ or higher. With this arrangement, a favorable ohmic contact of the third contact layer with an electrode metal can be realized and the operation voltage can be lowered.

According to another aspect of the present invention, there is provided a process for producing a semiconductor laser device in which an active layer is sandwiched between first-conductivity type and second-conductivity type cladding layers, and a second-conductivity type contact layer is disposed above the second cladding layer with an intermediate bandgap layer interposed between the second cladding layer and the contact layer, the second-conductivity type contact layer having a bandgap different from a bandgap of the second-conductivity type cladding layer, the intermediate bandgap layer having an intermediate bandgap between the bandgaps of the second-conductivity type cladding layer and the second-conductivity type contact layer, the process comprising, after forming the active layer:

forming the second-conductivity type cladding layer by molecular beam epitaxial method;

forming the second-conductivity type intermediate bandgap layer on the second-conductivity type cladding layer by molecular beam epitaxial method; and forming the second-conductivity type contact layer on the intermediate bandgap layer by molecular beam epitaxial method, wherein the step of forming the second-conductivity type contact layer comprises forming at least a first contact layer, an intermediate second contact layer, and a third contact layer such that the second contact layer has an impurity density lower than impurity densities of the first and third contact layers.

The process may further comprise:

forming a stripe-shaped region for injecting an electric current into the active layer; and forming a first-conductivity type current block layer in regions other than the current injection region by molecular beam epitaxial method.

Use of the molecular beam epitaxial ("MBE") method for the crystal growth of the stacked semiconductor structure allows Be to be used as a p-type impurity. Furthermore, the MBE method suppresses abnormal growth of crystals such as projection-like crystals in proximity of a ridge (the current injection region) when forming the current block layer, and realizes a smooth crystal surface with little unevenness. For that reason, the aftertreatment is easy, thus simplifying the processes. Further, when a laser chip is mounted on a heat radiation material in a junction-down manner, because the laser chip is superior in adhesion properties, the temperature characteristics of the semiconductor laser device are improved.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not intended to limit the present invention.

DETAILED DESCRIPTION OF THE PREFERRED EMBODIMENT

Figure 1:
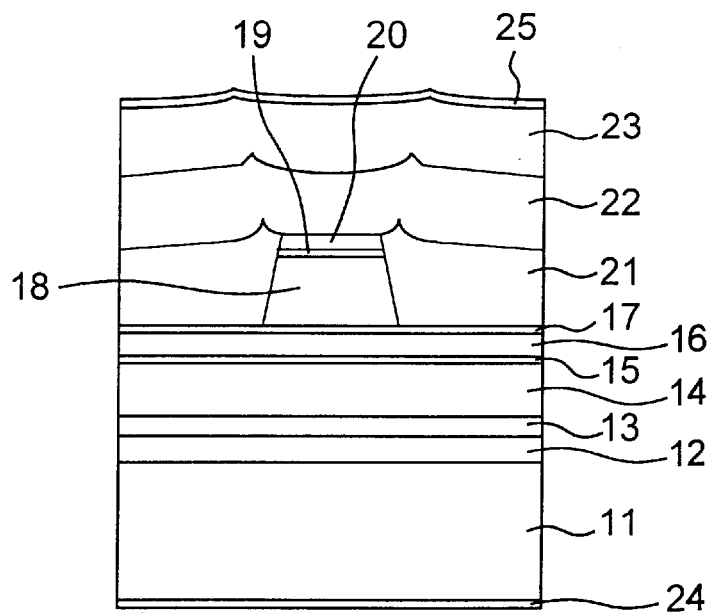
FIG. 1 is a sectional structural view of a semiconductor laser device according to a first embodiment of the invention.

Embodiments of the present invention will be hereinafter described in detail with reference to the drawings.
First Embodiment FIG. 1 shows a sectional structure of an AlGaInP semiconductor laser device. This element has been fabricated as follows. First, as a first epitaxial growth, using MBE method, an n-type GaAs buffer layer 12 (layer thickness: 0.5 $\mu$m), an n-type GaInP buffer layer 13 (layer thickness: 0.5 $\mu$m), an n-type AlGaInP cladding layer 14 (layer thickness: 1.2 $\mu$m), a GaInP active layer 15 (layer thickness: 200 Å), a p-type AlGaInP first cladding layer 16 (layer thickness: 0.2 $\mu$m), a GaInP etching stop layer 17 (layer thickness: 80 Å), a p-type AlGaInP second cladding layer 18 (layer thickness: 1.0 $\mu$m), a p-type GaInP intermediate bandgap layer 19 (layer thickness: 0.1 $\mu$m), and a p-type GaAs first contact layer 20 (layer thickness: 0.5 $\mu$m) are grown in order on an n-type GaAs substrate 11. The n-type AlGaInP cladding layer 14, the GaInP active layer 15, and the p-type AlGaInP first cladding layer 16 constitute a light-emitting stacked structure.

Next, using an Al$_2$O$_3$ film (not shown) as a mask, for example, conventional photolithography and wet etching are performed to remove the p-type GaAs first contact layer 20, the p-type GaInP intermediate bandgap layer 19 and the p-type AlGaInP second cladding layer 18 partially, thereby forming a stripe-shaped ridge as a current injection region.

As a second epitaxial growth, an n-type GaAs current block layer 21 (layer thickness: 1.5 $\mu$m) is grown on both sides of the stripe-shaped ridge. At this time, unnecessary n-type GaAs crystals (not shown) that have grown on the Al$_2$O$_3$ film (not shown) are removed and then the Al$_2$O$_3$ film (not shown) is removed. Lastly, by a third epitaxial growth, a p-type GaAs second contact layer 22 (layer thickness: 2.0 $\mu$m) and a p-type GaAs third contact layer 23 (layer thickness: 2.0 $\mu$m) are formed on the entire surface of the wafer. Then, an n-type electrode 24 and a p-type electrode 25 are formed to obtain a semiconductor laser device.

The impurity densities of the layers were set to the following: $1\times10^{18}$ cm$^{-3}$ for the p-type AlGaInP second cladding layer 18; $1\times10^{19}$ cm$^{-3}$ for the p-type GaInP intermediate bandgap layer 19; $1\times10^{19}$ cm$^{-3}$ for the p-type GaAs first contact layer 20; $3\times10^{18}$ cm$^{-3}$ for the p-type GaAs second contact layer 22; and $7\times10^{18}$ cm$^{-3}$ for the p-type GaAs third contact layer 23. That is, the impurity density of the p-type GaAs second contact layer 22 is set lower than the impurity densities of the p-type GaInP intermediate bandgap layer 19, the p-type GaAs first contact layer 20 and the p-type GaAs third contact layer 23. Further, the impurity density of the p-type GaAs first contact layer 20 is set to be the same as that of the p-type intermediate bandgap layer 19. As the p-type impurities, Be is used in each of these layers.

Figure 2:
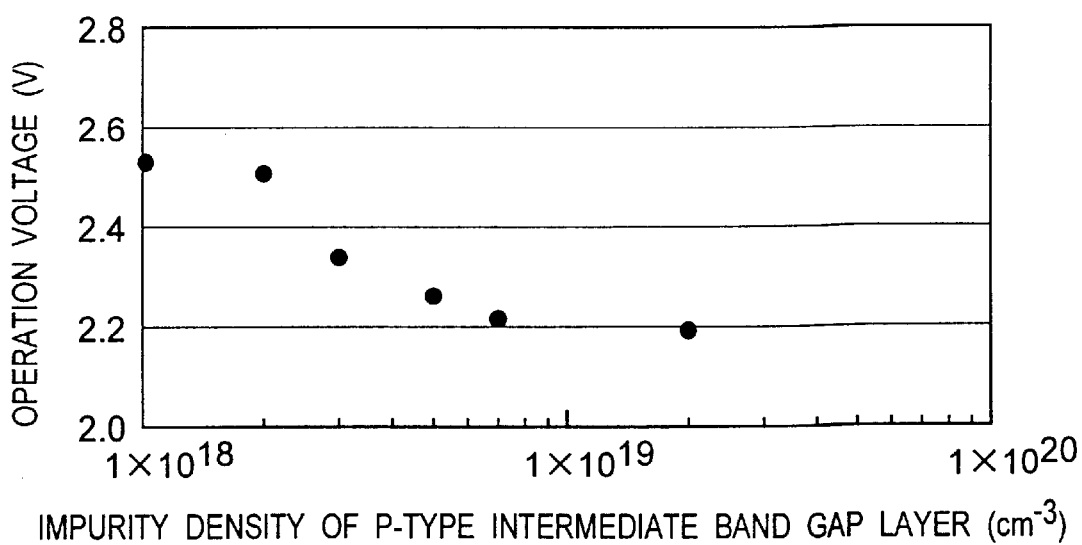
FIG. 2 is a graph showing the relationship between the impurity density of a p-type intermediate bandgap layer and the operation voltage of a semiconductor laser device.

With respect to the semiconductor laser device structure shown in FIG. 1, the relationship between the impurity densities in each layer and the operation voltage of the semiconductor laser device was intensively studied. The operation voltage here is a value when the optical output is 7 mW. FIG. 2 is a graph showing the relationship between the impurity density of the p-type intermediate bandgap layer 19 and the operation voltage of the semiconductor laser device. This figure reveals that the operation voltage is not more than 2.3 V when the impurity density of the p-type intermediate bandgap layer 19 is 5×1018 cm−3 or higher. This result indicates that the high impurity density of the p-type intermediate bandgap layer 19 has suppressed the influence of band discontinuity in the valence band. Therefore, the impurity density of the p-type intermediate bandgap layer 19 is required to be at least $5\times10_{18}$ cm$^{-3}$. Preferably, the impurity density of the p-type intermediate bandgap layer is $1\times10^{19}$ cm$^{-3}$ or more, at which a lower operation voltage of 2.2 V or less was realized.

Figure 3:
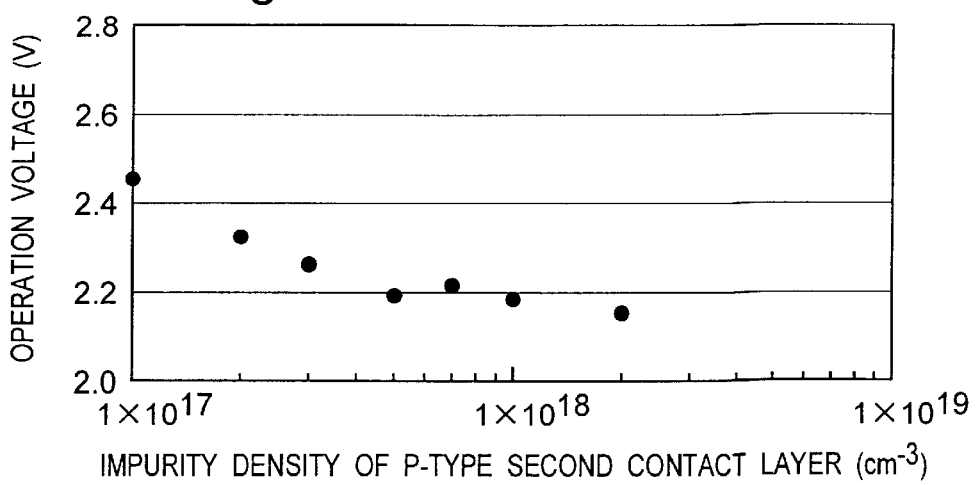
FIG. 3 is a graph showing the relationship between the impurity density of a p-type second contact layer and the operation voltage of a semiconductor laser device.

FIG. 3 is a graph showing the relationship between the impurity density of the p-type second contact layer 22 and the operation voltage of the semiconductor laser device. Since the p-type second contact layer 22 is not directly in contact with the p-type intermediate bandgap layer 19, it does not greatly affect the operation voltage. However, when the impurity density is lower than $5\times10^{17}$ cm$^{-3}$, the operation voltage increases to 2.3 V or more because the resistance of the p-type second contact layer itself 22 increases. Accordingly, the impurity density of the p-type second contact layer 22 is required to be at least $5\times10^{17}$ cm$^{-3}$.

Figure 4:
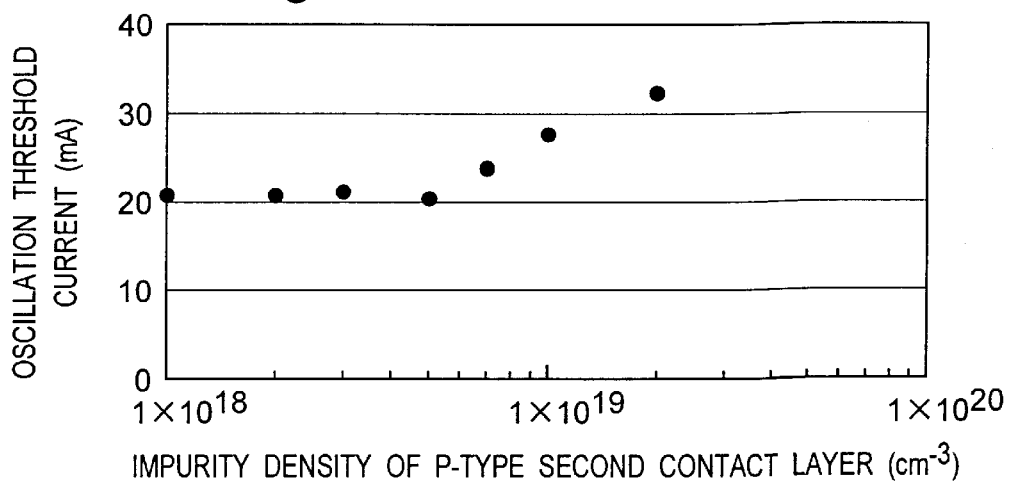
FIG. 4 is a graph showing the relationship between the impurity density of the p-type second contact layer and the oscillation threshold current of a semiconductor laser device.

FIG. 4 is a graph showing the relationship between the impurity density of the p-type second contact layer 22 and the oscillation threshold current. The figure reveals that when the impurity density is higher than $5\times10^{18}$ cm$^{-3}$, the oscillation threshold current increases. This is because increased impurities are diffused from the p-type second contact layer 22 to the active layer 15. Accordingly, the impurity density of the p-type second contact layer 22 is required to be $5\times10^{18}$ cm$^3$ or less.

Figure 5:
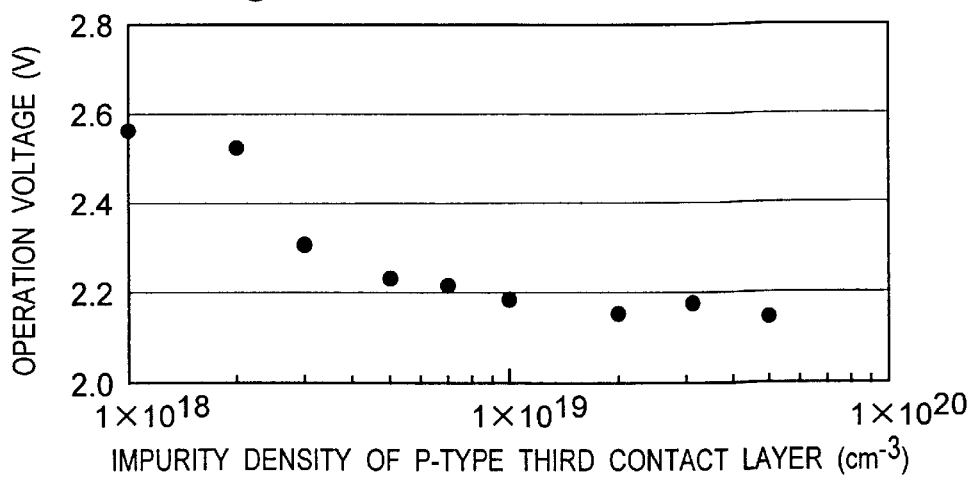
FIG. 5 is a graph showing the relationship between the impurity density of a p-type third contact layer and the operation voltage of a semiconductor laser device.

FIG. 5 is a graph showing the relationship between the impurity density of the p-type third contact layer 23 and the operation voltage of the semiconductor laser device. Since the p-type third contact layer 23 is put in ohmic contact with the p-electrode 25, it turns out that an impurity density of at least $5\times10^{18}$ cm$^{-3}$ is required in order to reduce the operation voltage. More preferably, an impurity density of at least $1\times10^{19}$ cm$^{-3}$ can realize an operation voltage of 2.2 V or less.

Figure 6:
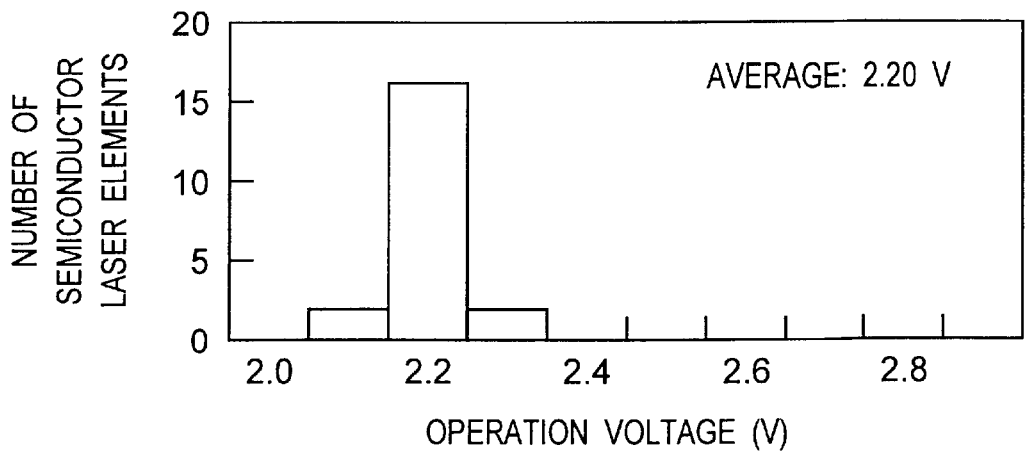
FIG. 6 is a graph showing a distribution of operation voltages of semiconductor laser devices of the first embodiment at room temperature.
Figure 7:
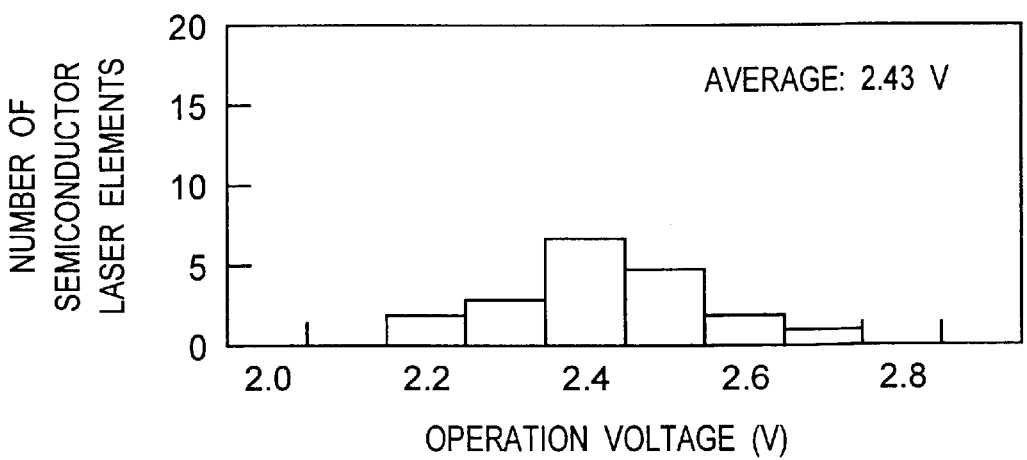
FIG. 7 is a graph showing a distribution of operation voltages of semiconductor laser devices of prior art at room temperature.

FIG. 6 and FIG. 7 show the distribution of the operation voltages (optical output: 7 mW) of the semiconductor laser devices at room temperature in the first embodiment and in the prior art example, respectively. In the prior art example, the operation voltage is widely varied from 2.2 V to 2.7 V (average: 2.43 V), but the variation was suppressed to 2.1–2.3 V (average: 2.20 V) in the first embodiment. The graph also shows that the average operation voltage was reduced by 0.23 V.

That is, it is presumed that the above-mentioned suppressed variation and reduction of the operation voltage is attributed to the suppression of the impurity diffusion from the intermediate bandgap layer. In other words, the impurity density at the interface between the p-type GaInP intermediate bandgap layer 19 and the p-type GaAs first contact layer 20 was maintained as previously set, and thus the interfacial band discontinuity was reduced sufficiently.

At the same time, since the impurity density of the p-type GaAs second contact layer 22 is set lower than that of the p-type GaAs first contact layer 20, it was possible to suppress diffusion of Be atoms to the GaAsInP active layer 15 to thereby suppress an increase in the oscillation threshold current.

Second Embodiment

Figure 8:
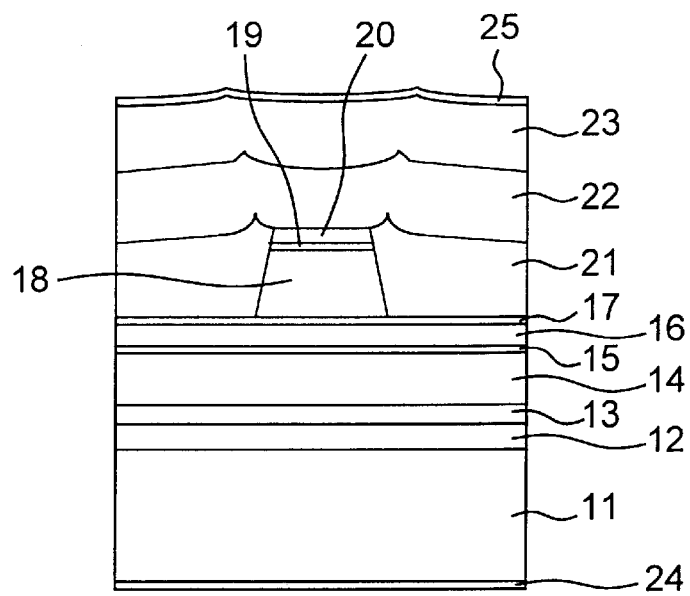
FIG. 8 is a sectional structural view of a semiconductor laser device according to a second embodiment of the present invention.
Figure 9:
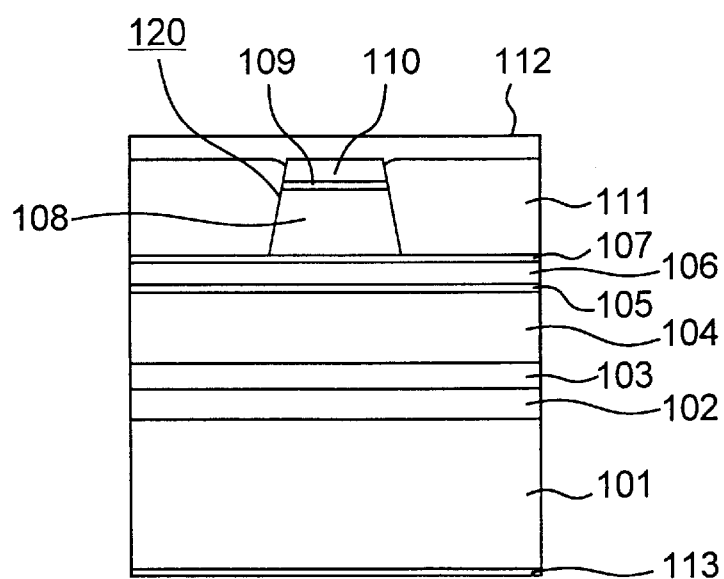
FIG. 9 is a sectional structural view of a semiconductor laser device in a prior art example.
Figure 10:
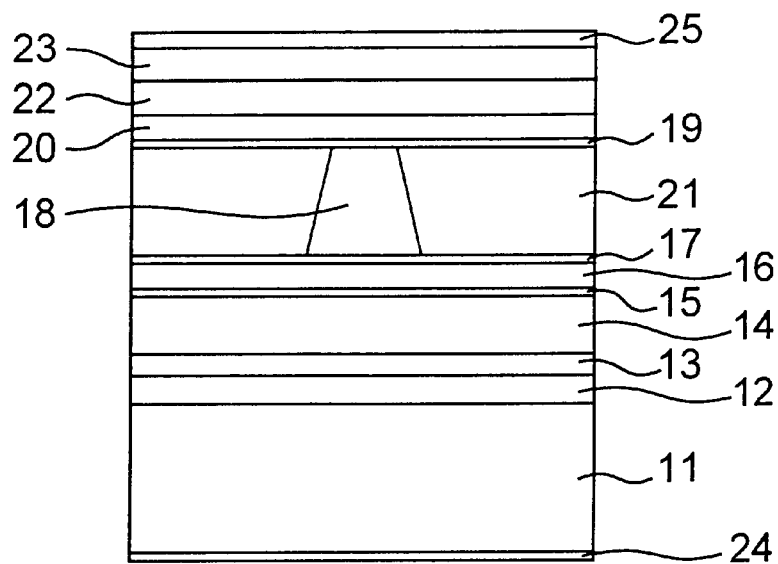
FIGS. 10 and 11 show variants of the ridge region in the semiconductor laser devices according to the first and second embodiments of the present invention.
Figure 11:
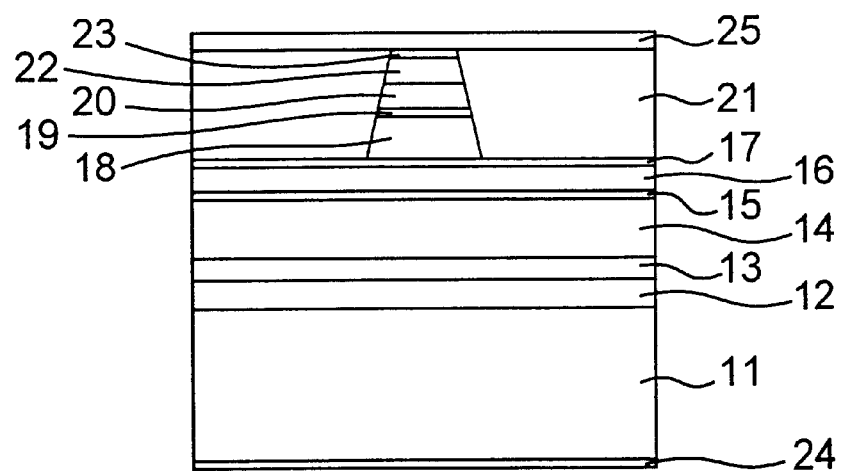

FIG. 8 is a sectional structural view of an AlGaInP semiconductor laser device according to a second embodiment, in which figure those parts which have the same functions as those in FIG. 1 are denoted by the same numerals. The AlGaInP semiconductor laser element of this embodiment has been produced by a process similar to that for the first embodiment.

In the second embodiment, a p-type AlGaInP second cladding layer 18 has a density of $1\times10^{18}$ cm$^{-3}$, a p-type GaInP intermediate bandgap layer 19 has a density of $7\times10^{18}$ cm$^{-3}$, a p-type GaAs first contact layer 20 has a density of $1\times10^{19}$ cm$^{-3}$, a p-type GaAs second contact layer 22 has a density of $3.5\times10^{18}$ cm$^{-3}$, and a p-type GaAs third contact layer 23 has a density of $7\times10^{18}$ cm$^{-3}$.

That is, the impurity density of the p-type GaAs second contact layer 22 is set lower than the impurity densities of the p-type GaInP intermediate bandgap layer 19, the p-type GaAs first contact layer 20 and of the p-type GaAs third contact layer 23. Further, the impurity density of the p-type GaAs first contact layer 20 is set to be higher than that of the p-type intermediate bandgap layer 19. As the p-type impurity, Be is used in each layer.

In this case, during the epitaxial growth of the p-type GaAs first contact layer 20 after the epitaxial growth of the p-type GaInP intermediate bandgap layer 19, the Be atoms in the p-type GaAs first contact layer 20 are diffused toward the p-type GaInP intermediate bandgap layer 19. Thus, the impurity density at the interface of them is higher than the set value of the p-type GaInP intermediate bandgap layer 19. As a result, the band discontinuity of the valence band at the interface is reduced more. The average of the operation voltages at room temperature of semiconductor laser devices according to the second embodiment (optical output: 7 mW) was 2.19 V or less. That is, in the second embodiment, the operation voltage was more reduced as compared with the first embodiment.

The embodiments described above use the GaInP active layer, but it goes without saying that similar effects can be obtained when using other active layer structures such as a pseudomorphic multi-quantum well active layer structure. In addition, the intermediate bandgap layer may be made of a material other than GaInP, which was shown in the embodiments, and the effect of the present invention can be exhibited as long as the intermediate bandgap layer is made of crystals having a bandgap between the contact layer and the cladding layer. Further, the impurity density may also be changed continuously instead of being changed stepwise as in the embodiments. Also, at the time of the first epitaxial growth, the layers up to the p-type second contact layer may be grown, and a ridge stripe even including the p-type second contact layer may be formed. Alternatively, at the time of the first epitaxial growth, the layers up to the p-type second cladding layer may be grown, and a ridge stripe including only the p-type second cladding layer may be formed. In this case, at the time of the third epitaxial growth, the intermediate bandgap layer and the p-type first to third contact layers are formed. Further, at the time of the first epitaxial growth, the layers up to the p-type third contact layer may be grown, and a ridge stripe including layers from the p-type second cladding layer up to the third contact layer may be formed. Further, the p-type contact layer may include four or more contact layers. It is to be noted that the present invention is not limited to AlGaInP materials, but is applicable to other materials having large band discontinuity between the cladding layer and the contact layer, such as, for example, GaN type materials.

As described above, according to the present invention, in the structure in which the intermediate layer having a bandgap intermediate between the cladding layer and the contact layer is inserted between these layers in order to improve the band discontinuity at the hetero-interface between these layers, the diffusion of impurities due to thermal history and so on at the time of the crystal growth is suppressed, and the desired impurity density can be secured. Thus, a reduction in the operation voltage can be contrived. Further, the distribution of the operation voltage can be narrowed, which has made it possible to achieve an improvement in the good product yield.

The invention being thus described, it will be apparent that the same may be varied in many ways. Such variations are not to be regarded as a departure from the spirit and scope of the invention, and all such modifications as would be apparent to one skilled in the art are intended to be included within the scope of the following claims.

What is claimed is:

1. A semiconductor laser device comprising:
   an active layer;
   a first-conductivity type cladding layer and a second-conductivity type cladding layer sandwiching the active layer therebetween;
   a second-conductivity type contact layer disposed above the second-conductivity type cladding layer and having a bandgap different from a bandgap of the second-conductivity type cladding layer; and
   a second-conductivity type intermediate bandgap layer disposed between the second-conductivity type cladding layer and the second-conductivity type contact layer and having an intermediate bandgap between the bandgaps of the second-conductivity type cladding layer and the second-conductivity type contact layer,
   wherein said second-conductivity type contact layer comprises at least a first contact layer, an intermediate second contact layer and a third contact layer stacked in this order and the second contact layer has an impurity density lower than impurity densities of the first and third contact layers.

2. The semiconductor laser device according to claim 1, wherein the second-conductivity type cladding layer has an impurity density smaller than that of the intermediate bandgap layer, and the impurity density of the intermediate bandgap layer is equal to or smaller than that of the first contact layer.

3. The semiconductor laser device according to claim 1, having a stripe-shaped region for injecting an electric current into the active layer and wherein a first-conductivity type current block layer is provided in regions other than the stripe-shaped region.

4. The semiconductor laser device according to claim 3, wherein the second-conductivity type cladding layer comprises a first cladding layer and a second cladding layer on or above the first cladding layer, and the stripe-shaped region for injecting an electric current into the active layer comprises at least the second cladding layer from among the second cladding layer, the intermediate bandgap layer and the second-conductivity type contact layer.

5. The semiconductor laser device according to claim 1, wherein each of the first-conductivity type cladding layer, the active layer, the second-conductivity type cladding layer and the intermediate bandgap layer is made of $(Al_xGa_{1-x})_yIn_{1-y}P$ ($0 \leq x \leq 1$, $0 < y < 1$).

6. The semiconductor laser device according to claim 1, wherein the second-conductivity type contact layer is made of GaAs.

7. The semiconductor laser device according to claim 1, wherein the second-conductivity type is a p type, and the second-conductivity type cladding layer, the second-conductivity type intermediate bandgap layer and the second-conductivity type contact layer contain beryllium as a p-type impurity.

8. The semiconductor laser device according to claim 7, wherein the intermediate bandgap layer has an impurity density of $5 \times 10^{18}$ cm$^{-3}$ or higher.

9. The semiconductor laser device according to claim 7, wherein the second contact layer has an impurity density in the range between $5 \times 10^{17}$ cm$^{-3}$ and $5 \times 10^{18}$ cm$^{-3}$ inclusive.

10. The semiconductor laser device according to claim 7, wherein the third contact layer has an impurity density of $5 \times 10^{18}$ cm$^{-3}$ or higher.

11. A process for producing a semiconductor laser device in which an active layer is sandwiched between first-conductivity type and second-conductivity type cladding layers, and a second-conductivity type contact layer is disposed above the second cladding layer with an intermediate bandgap layer interposed between the second cladding layer and the contact layer, the second-conductivity type contact layer having a bandgap different from a bandgap of the second-conductivity type cladding layer, the intermediate bandgap layer having an intermediate bandgap between the bandgaps of the second-conductivity type cladding layer and the second-conductivity type contact layer, the process comprising, after forming the active layer:

forming the second-conductivity type cladding layer by molecular beam epitaxial method;

forming the second-conductivity type intermediate bandgap layer on the second-conductivity type cladding layer by molecular beam epitaxial method; and forming the second-conductivity type contact layer on the intermediate bandgap layer by molecular beam epitaxial method, wherein the step of forming the second-conductivity type contact layer comprises forming at least a first contact layer, an intermediate second contact layer, and a third contact layer such that the second contact layer has an impurity density lower than impurity densities of the first and third contact layers.

12. The process according to claim 11, wherein the second-conductivity type cladding layer has an impurity density smaller than that of the intermediate bandgap layer, and the impurity density of the intermediate bandgap layer is equal to or smaller than that of the first contact layer.

13. The process according to claim 11, further comprising:

forming a stripe-shaped region for injecting an electric current into the active layer; and forming a first-conductivity type current block layer in regions other than the current injection region by molecular beam epitaxial method.

14. The process according to claim 13, wherein the step of forming the second-conductivity type cladding layer comprises forming a second-conductivity type first cladding layer and a second-conductivity type second cladding layer; and the step of forming a stripe-shaped region for injecting an electric current into the active layer is performed after forming at least the second-conductivity type second cladding layer such that the stripe-shaped region comprises at least the second-conductivity type second cladding layer from among the second cladding layer, the intermediate bandgap layer and the second-conductivity type contact layer.

15. The process according to claim 11, wherein each of the first-conductivity type cladding layer, the active layer, the second-conductivity type cladding layer and the intermediate bandgap layer is made of $(Al_xGa_{1-x})_yIn_{1-y}P$ ($0 \leq x \leq 1$, $0 < y < 1$).

16. The process according to claim 11, wherein the second-conductivity type contact layer is made of GaAs.

17. The method according to claim 11, wherein the second-conductivity type is a p type, and beryllium is used as a p-type impurity for the second-conductivity type cladding layer, the second-conductivity type intermediate bandgap layer, and the second-conductivity type contact layer.

18. The process according to claim 17, wherein the impurity density of the intermediate bandgap layer is set to $5 \times 10^{18}$ cm$^{-3}$ or higher.

19. The process according to claim 17, wherein the impurity density of the second contact layer is set in the range between $5 \times 10^{17}$ cm$^{-3}$ and $5 \times 10^{18}$ cm$^{-3}$ inclusive.

20. The process according to claim 17, wherein the impurity density of the third contact layer is set to $5 \times 10^{18}$ cm$^{-3}$ or higher.

* * * * *